(12) United States Patent  (10) Patent No.: US 7,382,043 B2
Longden et al. (45) Date of Patent: Jun. 3, 2008

(54) METHOD AND APPARATUS FOR SHIELDING AN INTEGRATED CIRCUIT FROM RADIATION

(75) Inventors: Larry L. Longden, San Diego, CA (US); Janet Patterson, San Diego, CA (US)

(73) Assignee: Maxwell Technologies, Inc., San Diego, CA (US)

( * ) Notice: Subject to any disclaimer, the term of this patent is extended or adjusted under 35 U.S.C. 154(b) by 0 days.

(21) Appl. No.: 10/065,209

(22) Filed: Sep. 25, 2002

(65) Prior Publication Data

US 2004/0056334 A1 Mar. 25, 2004

(51) Int. Cl.
*H01L 23/552* (2006.01)
(52) U.S. Cl. ..................................... 257/660
(58) Field of Classification Search ................ 257/659, 257/660, 699, 708, 710; 250/660, 515.1, 250/516.4, 516.1, 519.1; 361/816
See application file for complete search history.

(56) References Cited

U.S. PATENT DOCUMENTS

| | | |
|---|---|---|
| 4,922,754 A | 5/1990 | Horne et al. |
| 5,001,528 A | 3/1991 | Bahraman |
| 5,006,479 A | 4/1991 | Brandewie |
| 5,024,965 A | 6/1991 | Chang et al. |
| 5,047,260 A | 9/1991 | Durand |
| 5,086,443 A * | 2/1992 | Bloch et al. ............... 378/145 |
| 5,096,851 A | 3/1992 | Yamazaki et al. |
| 5,138,430 A | 8/1992 | Gow, 3rd et al. |
| 5,139,969 A | 8/1992 | Mori |
| 5,140,390 A | 8/1992 | Li et al. |
| 5,149,662 A | 9/1992 | Eichelberger |
| 5,151,770 A | 9/1992 | Inoue |
| 5,166,772 A | 11/1992 | Soldner et al. |
| 5,180,513 A | 1/1993 | Durand |
| 5,202,536 A | 4/1993 | Buonanno |
| 5,206,794 A | 4/1993 | Long |
| 5,220,192 A | 6/1993 | Owens et al. |
| 5,239,126 A | 8/1993 | Oshiba |
| 5,250,845 A | 10/1993 | Runyan |
| 5,268,331 A | 12/1993 | Abbott |

(Continued)

FOREIGN PATENT DOCUMENTS

EP 0160 327 11/1985

(Continued)

OTHER PUBLICATIONS

"Electronics Packaging and Production", p. 26-27.

(Continued)

*Primary Examiner*—David A Zarneke
*Assistant Examiner*—Jenny L Wagner
(74) *Attorney, Agent, or Firm*—Anatoly S. Weiser, Esq.

(57) ABSTRACT

A radiation shielding integrated circuit device comprising a x-ray shielding layer for shielding an electronic circuit device from receiving an amount of x-rays greater than the total dose tolerance of the electronic circuit device; a base coupled to the x-ray shielding layer; a radiation shielding top coupled to the base; a radiation shielding bottom coupled to the base; and the electronic circuit device coupled to the x-ray shielding layer; wherein the electronic circuit device is shielded from receiving an amount of radiation greater than a total dose tolerance of the electronic circuit device.

22 Claims, 6 Drawing Sheets

U.S. PATENT DOCUMENTS

| | | |
|---|---|---|
| 5,294,826 A | 3/1994 | Marcantonio et al. |
| 5,304,750 A | 4/1994 | Schubert et al. |
| 5,317,107 A | 5/1994 | Osorio |
| 5,324,952 A | 6/1994 | Cummings |
| 5,384,477 A | 1/1995 | Bulucea et al. |
| 5,406,117 A | 4/1995 | Dlugokecki et al. |
| 5,422,435 A | 6/1995 | Takiar et al. |
| 5,424,251 A | 6/1995 | Sono et al. |
| 5,426,566 A | 6/1995 | Beilstein, Jr. et al. |
| 5,436,411 A | 7/1995 | Pasch |
| 5,441,900 A | 8/1995 | Bulucea et al. |
| 5,495,394 A | 2/1996 | Kornfeld et al. |
| 5,495,398 A | 2/1996 | Takiar et al. |
| 5,498,900 A | 3/1996 | Dunaway et al. |
| 5,502,289 A | 3/1996 | Takiar et al. |
| 5,527,742 A | 6/1996 | Weiler et al. |
| 5,552,338 A | 9/1996 | Kang |
| 5,561,265 A | 10/1996 | Livshits et al. |
| 5,577,319 A | 11/1996 | Knecht |
| 5,578,526 A | 11/1996 | Akram et al. |
| 5,589,129 A | 12/1996 | Kato et al. |
| 5,610,443 A | 3/1997 | Inagaki et al. |
| 5,635,754 A * | 6/1997 | Strobel et al. ............. 257/659 |
| 5,672,918 A | 9/1997 | Kimbrough et al. |
| 5,706,840 A | 1/1998 | Schneider et al. |
| 5,714,102 A | 2/1998 | Highum et al. |
| 5,770,304 A | 6/1998 | Nakamura et al. |
| 5,780,163 A | 7/1998 | Camilletti et al. |
| 5,824,568 A | 10/1998 | Zechman |
| 5,825,042 A | 10/1998 | Strobel et al. |
| 5,828,425 A | 10/1998 | Kim |
| 5,851,852 A | 12/1998 | Ostop et al. |
| 5,864,088 A | 1/1999 | Sato et al. |
| 5,880,403 A | 3/1999 | Czajkowski et al. |
| 5,888,850 A | 3/1999 | Havens et al. |
| 5,889,316 A | 3/1999 | Strobel et al. |
| 5,935,177 A | 8/1999 | Cox et al. |
| 5,939,722 A | 8/1999 | Werner et al. |
| 5,992,237 A | 11/1999 | McCarty et al. |
| 5,998,867 A | 12/1999 | Jensen et al. |
| 6,064,555 A | 5/2000 | Czajkowski et al. |
| 6,097,080 A | 8/2000 | Nakanishi et al. |
| 6,118,184 A * | 9/2000 | Ishio et al. ............. 257/787 |
| 6,121,672 A | 9/2000 | Benedetto |
| 6,261,508 B1 | 7/2001 | Featherby et al. |
| 6,262,362 B1 * | 7/2001 | Czjakowski et al. ......... 174/360 |
| 6,365,960 B1 | 4/2002 | Pollock et al. |
| 6,368,899 B1 | 4/2002 | Featherby et al. |
| 6,455,864 B1 | 9/2002 | Featherby et al. |
| 6,720,493 B1 * | 4/2004 | Strobel et al. ............ 174/35 R |
| 6,778,637 B2 * | 8/2004 | Luhta et al. ............. 378/154 |

FOREIGN PATENT DOCUMENTS

| | | | |
|---|---|---|---|
| FR | 2584 863 | | 1/1987 |
| JP | 55 98846 | | 7/1980 |
| JP | 355128851 A | * | 10/1980 |
| JP | 56 103452 | | 8/1981 |
| JP | 356165341 A | * | 12/1981 |
| JP | 57 95650 | | 6/1982 |
| JP | 357145345 A | * | 9/1982 |
| JP | 60 106150 | | 6/1985 |
| JP | 60 124834 | | 7/1985 |
| JP | 60 180150 | | 9/1985 |
| JP | 61 004249 | | 1/1986 |
| JP | 61 4250 | | 1/1986 |
| JP | 62 125651 | | 6/1987 |
| JP | 62150776 A | * | 7/1987 |
| JP | 2 237053 | | 9/1990 |
| JP | 2 278740 | | 11/1990 |
| JP | 4 94560 | | 3/1992 |
| JP | 4 273200 | | 9/1992 |
| JP | 02001189876 A | * | 7/2001 |

OTHER PUBLICATIONS

Electronic Materials and Processes, Consulting and Short Courses; p. 1-3.

"Electronic Materials Handbook", p. 470-483.

C. Harper, "Electronic Packaging and Interconnection Handbook", McGraw Hill p. 6.41-6.49.

M. P. Baze et al., "Latch-up Paths in Bipolar Integrated Circuits", IEEE Transactions on Nuclear Science, Dec. 1986, vol. NS-33 No. 6.

A. H. Johnston et al., "The Effect of Temperature on Single-Particle Latch-Up", IEEE Transactions on Nuclear Science, Dec. 1991, vol. 38 No. 6.

Song et al., "Parametric Investigation of Latch-Up Sensitivity in 1.25 CMOS Technology", IEEE Transactions on Nuclear Science, Dec. 1987, vol. NS-34 No. 6.

D. G. Millward et al., The Effectiveness of RAD-PAK ICs for Space Radiation Hardening, 1990 Proceedings 40th Electronic Components and Technology Conference IEEE, vol. 2 pp. 913-916, 1990.

C. Harper, "Electronic Packaging and Interconnection Handbook", McGraw Hill 1997, p. 6.34.

Song et al., "Parametric Investigation of Latch-Up Sensitivity in 1.25 CMOS Technology", IEEE Transactions on Nuclear Science, Dec. 1987, vol. NS-34 No. 6.

D. G. Millward et al., The Effectivness of RAD-PAK ICs for Space Radiation Hardening, 1990 Proceedings 40th Electronic Components and Technology Conference IEEE, vol. 2 pp. 913-916, 1990.

C. Harper, "Electronic Packaging and Interconnection Handbook", McGraw Hill 1997, p. 6.34.

International Search Report for international application No. PCT/US03/30245 Apr. 14, 2004.

* cited by examiner

METHOD AND APPARATUS FOR SHIELDING AN INTEGRATED CIRCUIT FROM RADIATION

BACKGROUND OF INVENTION

1. Field of the Invention

The present invention relates generally to integrated circuits. More specifically, but without limitation thereto, the present invention relates shielding integrated circuits from ionizing radiation and x-rays.

2. Discussion of the Background Art

In many radiation environments electronic circuits must be shielded from ionizing radiation and x-rays in order to function properly. For example, in a space environment, circuit die must be shielded from ionizing radiation or the circuit may fail to function properly. In other environments, e.g., where the risk of exposure to artificial nuclear radiation is high, the circuit must be shielded from x-rays.

Previous practices use an ionizing radiation shield to shield from ionizing radiation found in the natural space environment. Ionizing radiation found in the natural space environment is comprised primarily of electrons and protons with a small number of ionized highly energetic heavy ions. The electrons and protons contribute to the integrated radiation damage of a semiconductor device and is frequently called ionizing radiation. Ionizing radiation creates total dose damage in electronic circuits. The damage is frequently cumulative over the entire time the device is in space or in the ionizing radiation environment. Since, for the most part, the ionizing radiation found in space is isotropic, incomplete coverage of package shielding allows for only a percentage of radiation to leak through, which percentage can be predetermined. As shown in FIG. 1, by way of example, this radiation leakage occurs through the sides of the packaging where there is no radiation shielding material. Ionizing radiation comes from every direction, therefore allowing a certain amount of side radiation leakage is acceptable as long as it does not exceed the total dose tolerance of the circuit die.

In contrast, x-ray radiation resulting from, e.g., artificial nuclear detonations comes from substantially a single direction, which in many instances can not be predetermined. This type of x-ray radiation, or burst radiation, usually comes from a man-made event such as a nuclear detonation. X-ray radiation usually generates dose rate damage in electronic devices, because of the extremely short time frame that the burst exist. This type of damage is different from the slower total dose damage that occurs for the natural space radiation environment. X-ray radiation is electromagnetic and therefore the shielding effectiveness of materials is different from that of ionizing radiation. Additionally, since the direction from which x-ray radiation, such as burst radiation, will come can't be predetermined and because substantially all of such radiation comes from substantially a single direction, the shielding shown in FIG. 1 is insufficient as a very large dose of x-ray radiation could come from an angle which is not protected.

FIG. 1 illustrates a shielding package designed to shield from ionizing radiation, such as found in a natural space environment.

FIG. 1 shows a radiation shielding top 102, a radiation shielding bottom 104, a plurality of circuit die 106, a plurality of conductors 108, a base 110, and a line of sight angle 112.

As shown in FIG. 1, the plurality of circuit die 106 are shielded by the radiation shielding top 102 and the radiation shielding bottom 104. This shielding is sufficient to shield the plurality of circuit die 106 from an amount of radiation greater than the total dose tolerance of the plurality of circuit die 106. However, the line of sight angle 112 represents an exposed line of sight not protected by shielding material. Therefore, burst radiation coming from within the line of sight angle 112 may directly impact with the plurality of circuit die 106 and cause severe damage or destroy the operation of the plurality of circuit die 106.

Thus there is a need for package design to eliminate the problems discussed above.

SUMMARY OF INVENTION

The present invention advantageously addresses the need above as well as other needs by providing a radiation shielding integrated circuit device.

In one embodiment the present invention includes a radiation shielding integrated circuit device comprising a x-ray shielding layer for shielding an electronic circuit device from receiving an amount of x-rays greater than-the total dose tolerance of the electronic circuit device; a base coupled to the x-ray shielding layer; a radiation shielding top coupled to the base; a radiation shielding bottom coupled to the base; and the electronic circuit device coupled to the x-ray shielding layer; wherein the electronic circuit device is shielded from receiving an amount of radiation greater than a total dose tolerance of the electronic circuit device.

In another embodiment the invention can be characterized as a method of shielding an integrated circuit device comprising forming a radiation shielding top and a radiation shielding bottom to shield the integrated circuit device from receiving an amount of radiation greater than a total dose tolerance of the integrated circuit device; forming a x-ray shielding layer; and selecting a thickness for the x-ray shielding layer to shield the integrated circuit device from x-rays such that the integrated circuit device receives an amount of x-rays less than the total dose tolerance of the integrated circuit device.

In yet another embodiment the invention advantageously includes method of shielding an integrated circuit device comprising forming a cavity in a base; forming a radiation shielding coating layer within the cavity in the base; coupling the integrated circuit device to the radiation shielding coating layer; and coupling a radiation shielding lid to the integrated circuit device package such that there is no line of sight angle at which x-rays could reach the integrated circuit device.

In a subsequent embodiment the present invention includes a radiation shielding integrated circuit device comprising a base; a first x-ray shielding layer coupled to the base; a second x-ray shielding layer coupled to the base; a first circuit die coupled to the first x-ray shielding layer; a second circuit die coupled to the second x-ray shielding layer; a radiation shielding top coupled to the base; and a radiation bottom coupled to the base; wherein the thickness of the x-ray shielding layer is selected to shield the first circuit die from receiving an amount of x-rays greater than the total dose tolerance of the first circuit device; wherein the thickness of the second radiation shielding tub is selected to shield the circuit die receiving an amount of x-rays greater than the total dose tolerance of the second circuit device.

BRIEF DESCRIPTION OF DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 2:
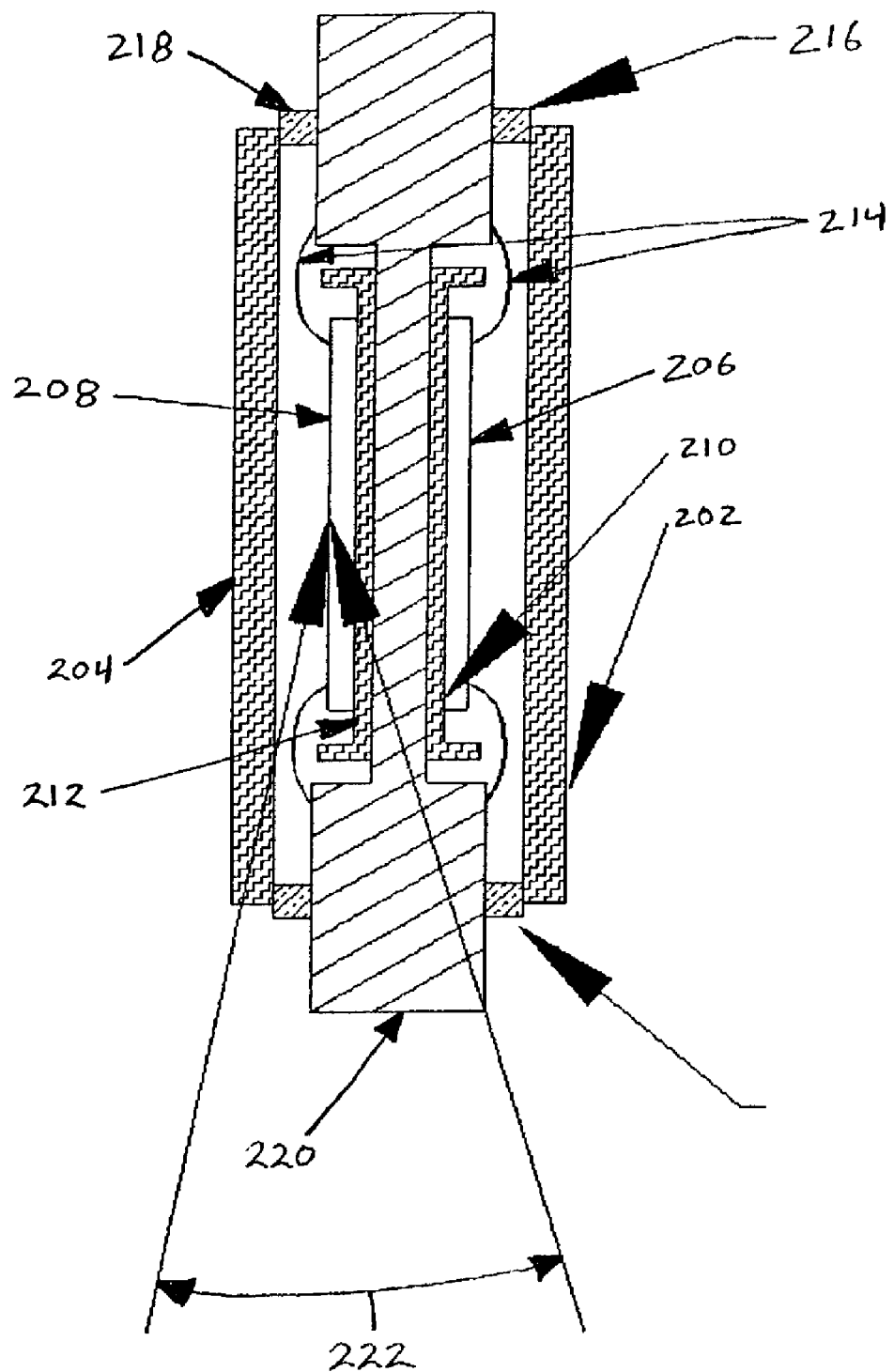
FIG. 2 illustrates a shielding package with no line of sight path for radiation to the integrated circuit.

FIG. 2 illustrates a shielding package with no line of sight path for radiation to the integrated circuit.

FIG. 2 shows a radiation shielding lid 202, a radiation shielding bottom 204, a first circuit die 206, a second circuit die 208, a first radiation shielding tub 210, a second radiation shielding tub 212, a plurality of conductors 214, a first spacing ring 216, a second spacing ring 218, a base 220, and an angle 222.

The first circuit die 206 is coupled to the first radiation shielding tub 210 such that the first circuit die 206 is sitting inside of the first radiation shielding tub 210. The first radiation shielding tub 210 has a bottom and a sidewall. The first radiation shielding tub 210 is coupled to the base 220. The radiation shielding lid 202 is also coupled to the base 220 through a first spacing ring 216 and provides shielding for the first circuit die 206. The second circuit die 208 is coupled to the second radiation shielding tub 212. The second radiation shielding tub 212 is coupled to an opposite side of the base 220 from the first radiation shielding tub 210. The radiation shielding bottom 204 is coupled to the base 220 through a second spacing ring 218 and provides shielding for the second circuit die 208. The sidewall extends upward far enough above the first circuit die 206 that no line of sight angle to the first circuit die 206.

The radiation shielding lid 202 and the first radiation shielding tub 210 are positioned such that there is no line of sight angle to the first circuit die 206. Having no line of sight angle to the first circuit die 206 means that there is no angle which radiation traveling in a straight line will be able to contact the first circuit die 206 without first contacting the radiation shielding lid 202 or the first radiation shielding tub 210. The sidewalls of the first radiation shielding tub 210 extend far enough above the first circuit die 206 that there is no line of sight radiation that could hit the first circuit die 206. Thus, radiation coming from any angle must contact the radiation shielding lid 202 or the first radiation shielding tub 210 before it can come in contact with the first circuit die 206. This reduces the likelihood of failure of the first circuit die 206. The second radiation shielding tub 212 and the radiation shielding bottom 204 function similarly to the first radiation shielding tub 210 and the radiation shielding top 202.

The angle 222 demonstrates that ionizing radiation and x-rays coming from a previously unprotected direction (see, e.g., FIG. 1) will come into contact with either the radiation shielding bottom 204 or the second radiation shielding tub 212 before contacting the second circuit die 208. Previous radiation shielding devices (see, e.g., FIG. 1) were designed only to shield from ionizing radiation and not from x-rays. The current design is designed to protect from both ionizing radiation and from x-rays. It is important that the current inventive device shield from x-rays coming from all angles as x-rays can come from a point source, such as a man-made nuclear detonation. Thus, the first radiation shielding tub 210 is designed such that x-rays coming from a point source will not destroy or damage the first circuit die 206.

In one embodiment of the present invention, the first radiation shielding tub 210 is a thickness and composition of material chosen such as to reduce the x-ray level at the first circuit die 206 below the total dose tolerance of the first circuit die 206 for the expected radiation environment. In the case the circuit device will be exposed to both natural space ionizing radiation and man-made x-rays, then both types of radiation are considered in determining the radiation environment. The radiation environment will be used to determine the thickness and material of the first radiation shielding tub 210 the second radiation shielding tub 212, the radiation shielding lid 202, and the radiation shielding bottom 204.

In accordance with one method of determining the material and thickness of the first radiation shielding tub 210, the first circuit die 206 is tested for it's tolerance to dose rate effects and it's total dose tolerance. Typically C0-60 gamma radiation sources are used to determine the total dose tolerance. High Flux Electron beams are used to determine the electronic circuits dose rate tolerance. Next the material and thickness required for the shielding is then determined by running transport modeling code for the expected mission radiation spectrum through shielding material. Third, the amount and type of material is then chosen such that the amount of x-rays transported through the material is less then the total dose and or dose rate tolerance of the first circuit die 206. This protects the first circuit die 206 from receiving an amount of x-rays which would exceed the total dose tolerance of the first circuit die 206. This process is repeated for the second circuit die 208 and the second radiation shielding tub 212.

Advantageously, the radiation shielding top 202 and the radiation shielding bottom 204 can be formed from a high Z material such as osmium, iridium, platinum, tantalum, gold, and tungsten. In general, any high Z material may be employed having an atomic number of 50 and above. More preferably, the range of atomic numbers can be between 60 and 100, inclusive. The most preferred range of atomic numbers is between 73 and 79, inclusive.

Alternatively, the radiation shielding top 202 and the radiation shielding bottom 204 can be made from a multiple layer shielding composition comprising a high Z layer and a low Z layer. Advantageously, the radiation shielding top and the radiation shielding bottom can be made from a multiple layer shielding composition comprising a high Z layer interposed between an outer low Z layer and an inner low Z layer. This configuration is an optimal shielding geometry for a geosynchronous orbit. The high Z layer is effective in stopping electrons and Bremsstrahlung radiation, while the low Z material is more effective in stopping protons. A geosynchronous orbit is dominated by trapped electrons, so it is preferable that the high Z layer is thicker than the two low Z layers.

The low Z layer is preferably selected from the group consisting of copper, nickel, carbon, titanium, chromium, cobalt, boron, silicon, iron and nitrogen. In general, any suitable low Z material may be employed having an atomic number of 30 and below, but the most preferred low Z materials are selected from the group consisting of copper, nickel, carbon, iron, titanium, silicon, and nitrogen.

The radiation shielding top 202 and the radiation shielding bottom 204 are of a sufficient thickness to shield the first circuit die 206 and the second circuit die 208 from an amount of radiation greater than the total dose tolerances of the first circuit die 206 and the second circuit die 208. This packaging is further described in U.S. Pat. No. 6,262,362 B1, of Czjakowski et al., for RADIATION SHIELDING OF THREE DIMENSIONAL MULTI-CHIP MODULES, incorporated herein by reference as if set forth in its entirety.

In accordance with a method for determining a shielding thickness, first, the total dose tolerances of the first circuit die 206 and the second circuit die 208 are determined. This test can be accomplished by a Cobalt-60 source or other irradiation source. Without the knowledge of what the inherent radiation tolerance is for the individual semiconductor device, the designer does not know how much or whether shielding is necessary.

Second, the radiation environment to which the first circuit die 206 and the second circuit die 208 will be exposed to is determined. This involves determining the radiation spectrum and dose depth curve of the particular mission or radiation requirement of the application. For orbits around the earth, this is calculated using conventional radiation transport codes in conjunction with conventional radiation spectrum tables. Alternatively, any known radiation environment can be modeled and subsequently a dose depth curve created for the modeled environment.

The next step involves determining the thickness and material of the radiation shielding top 202 and the radiation shielding bottom 204 such that the first circuit die 206 and the second circuit die 208 will not be exposed in the determined radiation environment to an amount of radiation greater than the total dose tolerances of the first circuit die 206 and the second circuit die 208, respectively. Once you know the total dose tolerances of the first circuit die 206 and the second circuit die 208 and the dose depth curve of the radiation environment, the amount of shielding required can be determined to bring first circuit die 206 and the second circuit die 208 within the tolerance. A suitable process for determining shielding thickness in accordance with the present embodiment is described in U.S. Pat. No. 6,261,508, of Featherby et al., for a METHOD FOR MAKING A SHIELDING COMPOSITION, incorporated herein by reference as if set forth in its entirety. Another method involves using the above mentioned modeling code to generate a dose versus depth curve in which the amount of shielding required to bring the total dose level under the electronic circuits total dose tolerance level is determined. The package shielding is then analyzed by comparing the amount of radiation from all directions and the amount of shielding that is supplied from each of those directions. The radiation at the electronic device level is the summation of all the different angles normalized for the package area.

The first radiation shielding tub 210 and the second radiation shielding tub 212 are also made from a high Z material. The material is chosen to shield from x-ray radiation. In one instance, x-ray radiation is generated by man-made events occurring from point sources. For example an nuclear detonation will create a point source for x-ray radiation. This type of radiation is distinguished from the natural ionizing radiation found in space in that it is generated in a burst occurring in less than a microsecond (instead of coming randomly over time) and it comes from one direction (rather than being isotropic). In one example, a nuclear detonation in space could come from any direction. Therefore, since the direction from which a burst of x-ray will occur can't be predetermined, the entire package has to be shielded from all directions, i.e., 360 degrees, three dimensions. Advantageously, the first radiation shielding tub 210 and the second radiation shielding tub 212 shield the first circuit die 206 and the second circuit die 208, respectively, from the previously unprotected side angles, i.e., side angles not previously protected from x-ray radiation of a level sufficient to damage the circuit die.

Advantageously, x-ray radiation can be shielded by a thinner piece of high Z material than is required, for example in the radiation shielding lid 202 or in the radiation shielding bottom 204 to shield the circuit die from ionizing radiation in excess of the circuit die's total dose tolerance. Unlike with ionizing radiation, such as is present in a space environment, the ability to shield an x-ray is much more dependent upon the type of material used, as opposed to the thickness of the material. Therefore, the high Z material chosen must shield x-rays, however the thickness of this material is thinner than the thickness of, for example, the radiation shielding top 202 or the radiation shielding bottom 204.

One example of shielding for x-rays would use a CuW (Copper Tungsten) alloy shield that is at least 3 mils thick from every angle. For structural integrity there is typically at least 15 mils thick of CuW. Additionally, since these parts also have to meet the total requirements of the natural space environment most part require at least 15 mils of CuW shielding. The minimal thickness of the first radiation shielding tub 210 is determined by running the x-ray spectrum and fluence through the x-ray transport modeling code discussed earlier.

Figure 1:
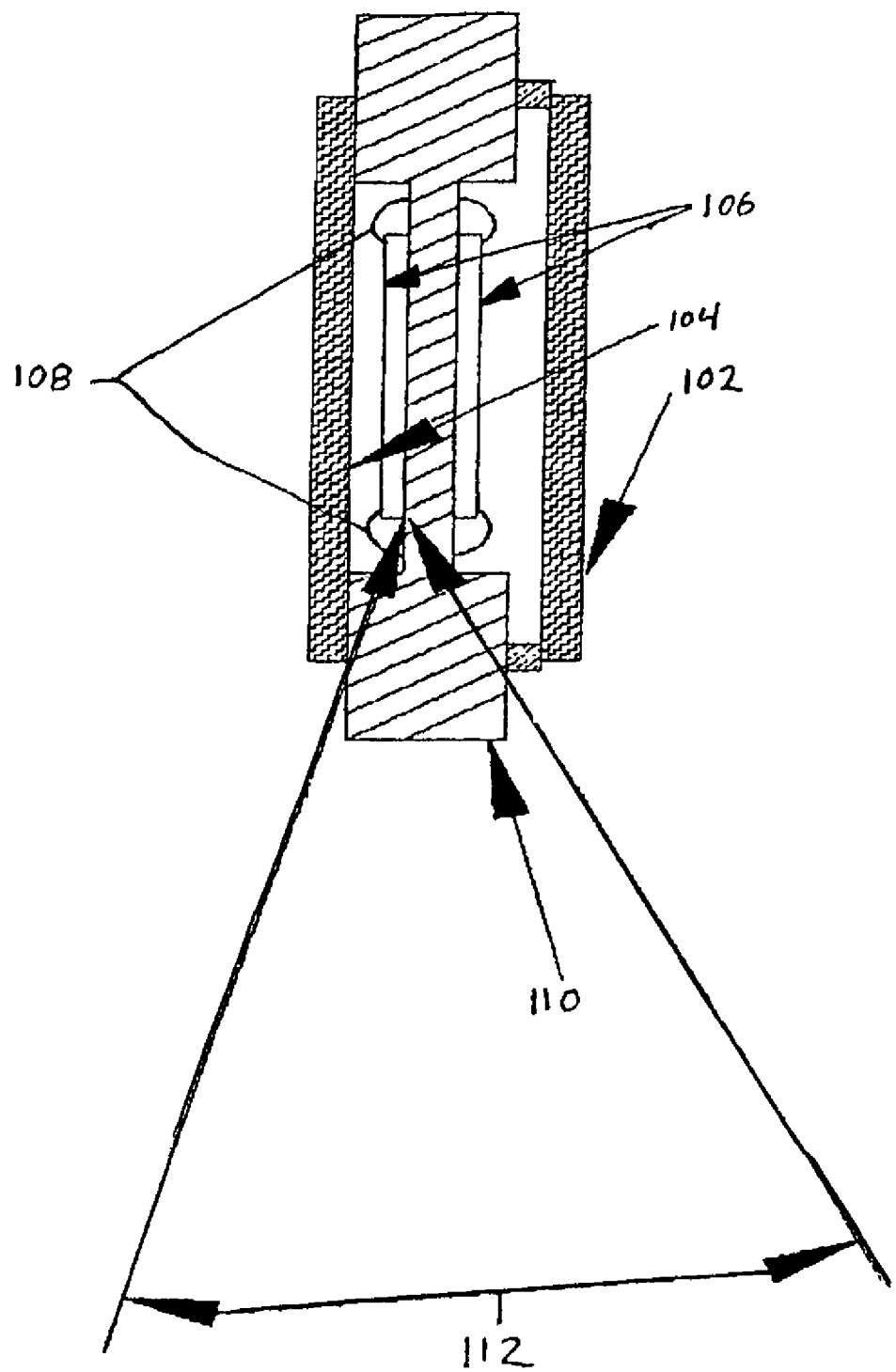
FIG. 1 illustrates a prior art shielding package designed to shield from radiation.

Prior art shielding devices such as shown in FIG. 1 can not effectively shield from x-rays coming from a point source within the line of sight angle 112. Additionally, prior art shielding devices, such as shown in FIG. 1, were designed to shield only ionizing radiation. The high Z material is chosen at a thickness to shield the circuit die such that an amount of ionizing radiation received by the circuit die is less than the total dose tolerance of the circuit die. In the prior art shielding device such as shown in FIG. 1, the base 110, although not a high Z material is thick enough to help shield the ionizing radiation coming from within the angle 112 such that the circuit die is not exposed to an amount of ionizing radiation greater than the total dose tolerance of the circuit die. However, the base 110 would not be able to shield from x-rays coming from within the angle 112. In contrast, the current inventive device is designed to shield from both ionizing radiation and x-ray radiation. The first radiation shielding tub 210 and second radiation shielding tub 212 have a thickness (and more importantly, a material composition) selected such that the first circuit die 206 and the second circuit die 208 will be protected from any x-rays coming from an angel which is not shielded by the radiation shielding top 202 or the radiation shielding bottom 204.

The first spacing ring 216 and the second spacing ring 218 are made from a high or low Z material depending on the radiation tolerance of the part and the radiation spectrum. The height of the sidewalls of the first radiation shielding tub 210 and the second radiation shielding tub 212 may be increased or decreased in order to make sure there is no line of sight angle through which radiation could come in contact with the first circuit die 206 or the second circuit die 208.

Figure 4:
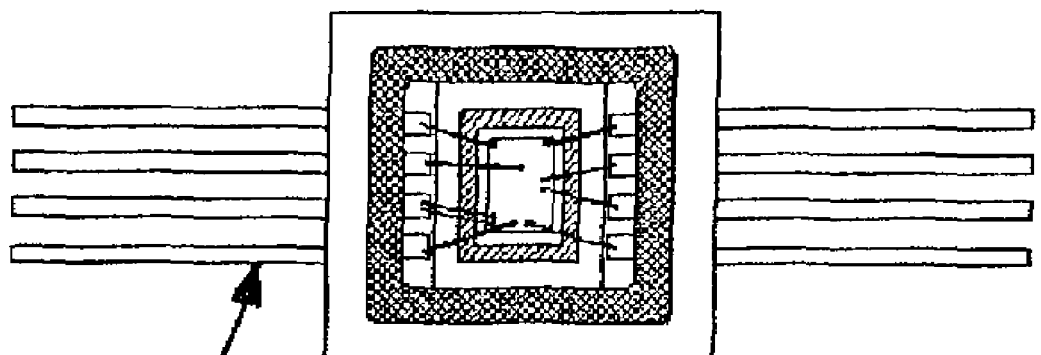
FIG. 4 illustrates a top view of the shielding package with no line of sight path for radiation of FIG. 3.
Figure 3:
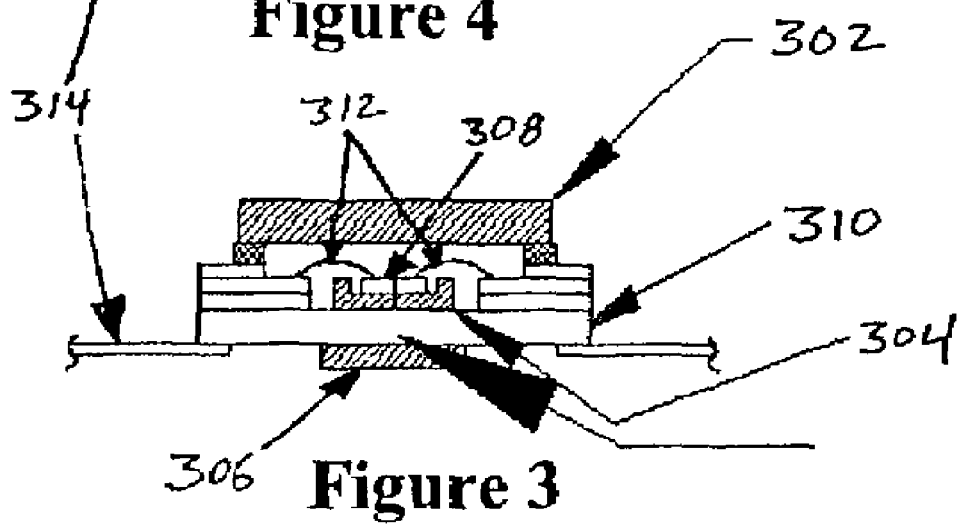
FIG. 3 illustrates a side view of another embodiment of a shielding package with no line of sight path for radiation to the integrated circuit.

FIG. 3 illustrates another embodiment of a shielding package with no line of sight path for radiation to the integrated circuit. FIG. 4 illustrates a top view of the shielding package of FIG. 3.

FIG. 3 shows a radiation shielding lid 302, a radiation shielding tub 304, a radiation shielding bottom 306, a circuit die 308, a base 310, a plurality of conductors 312, and a plurality of pin connectors 314.

The radiation shielding tub 304 is coupled to the base 310. The circuit die 308 is coupled to the inside of the radiation shielding tub 304. The radiation shielding top 302 is also coupled to the base 310. A plurality of conductors 312 are coupled to the circuit die 308 and to the plurality of pin connectors 314. The radiation shielding bottom 306 is coupled to a bottom of the base 310.

The radiation shielding top 302, the radiation shielding bottom 306 and the radiation shielding tub 304 are all high Z material, as describe above, or alternatively layers of high Z and low Z material. The radiation shielding top 302 and the radiation shielding tub 304 are positioned such that there is no line of sight angle which radiation could hit the circuit die 308. Thus, radiation coming from any angle must contact the radiation shielding top 302 or the radiation shielding tub 304 before it could come in contact with the circuit die 308. This reduces the likelihood of failure of the circuit die 308. The radiation shielding bottom 306 provides additional shielding for the circuit die from ionizing radiation.

The radiation shielding top 302 and the radiation shielding bottom 306 have a thickness chosen to shield the circuit die from ionizing radiation. The thicknesses are determined such that the circuit die 308 is not exposed to an amount of ionizing radiation greater than the total dose tolerance of the circuit die 308.

The circuit die 308 is positioned within the radiation shielding tub 304 such that radiation coming from an angle between the radiation shielding top 302 and the radiation shielding bottom 306 will have no line of sight path to the circuit die 308. The radiation shielding tub 304 is a high Z material and is a thickness designed to shield the circuit die 308 from x-rays. In one embodiment, the radiation shielding tub 304 is designed to shield from x-rays coming from a point source, such as a nuclear detonation.

As discussed earlier high Z materials are typically better at shielding x-rays while the natural space environment is comprised of electrons, protons and heavy ions of which the shielding effectiveness of a material varies depending on the relative composition of these types of radiation in the spectrum. Thus, in one embodiment of the present invention the radiation shielding tub 304 will be a high Z material, while the radiation shielding top 302 and the radiation shielding bottom 306 will be either a high Z material or a combination of high Z and low Z layers.

Figure 6:
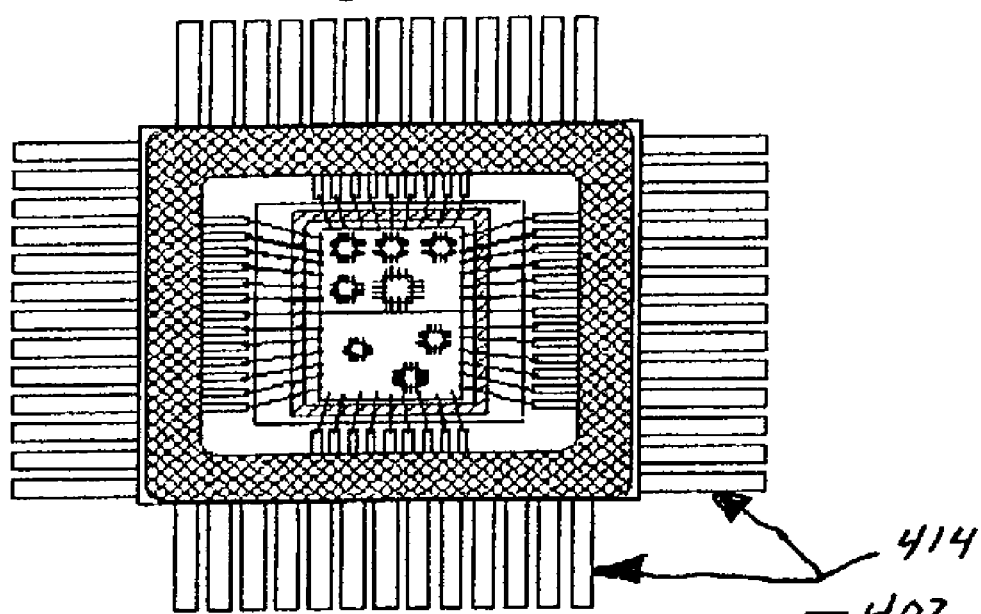
FIG. 6 illustrates a top view of the shielding package with no ling of sight path for radiation of FIG. 5.
Figure 5:
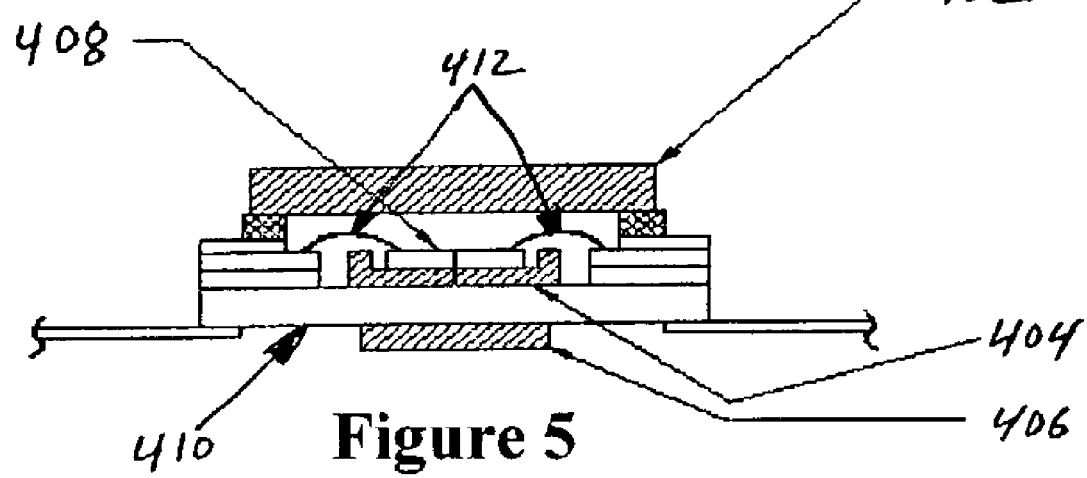
FIG. 5 illustrates a side view of another embodiment of a shielding package with no line of sight path for radiation to a plurality circuit die.

FIG. 5 illustrates another embodiment of a shielding package with no line of sight path for radiation to a plurality circuit die. FIG. 6 illustrates a top view of the shielding package shown in FIG. 5.

FIG. 5 shows a radiation shielding lid 402, a radiation shielding tub 404, a radiation shielding bottom 406, plurality of circuit die 408, a base 410, a plurality of conductors 412, and a plurality of pin connectors 414.

FIG. 5 is similar in function and structure to FIG. 3. However, FIG. 4 shows an embodiment with the plurality of circuit die 408 coupled to the base 410. FIG. 4 provides shielding for the plurality of circuit die 412 in one radiation shielding tub 404.

In this configuration, the total dose tolerance of the most sensitive of the plurality of circuit die 408 may be used in determining the thickness of the radiation shielding top 402 and the radiation shielding bottom 406.

Figure 8:
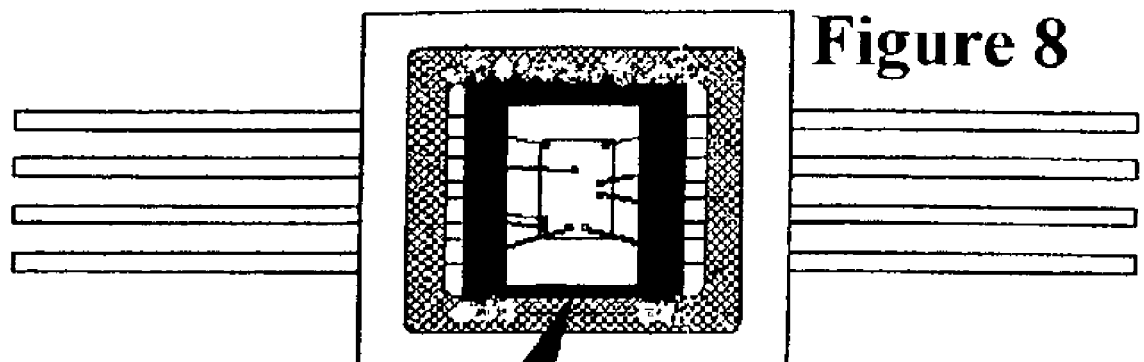
FIG. 8 illustrates a top view of the shielding package of FIG. 7.
Figure 7:
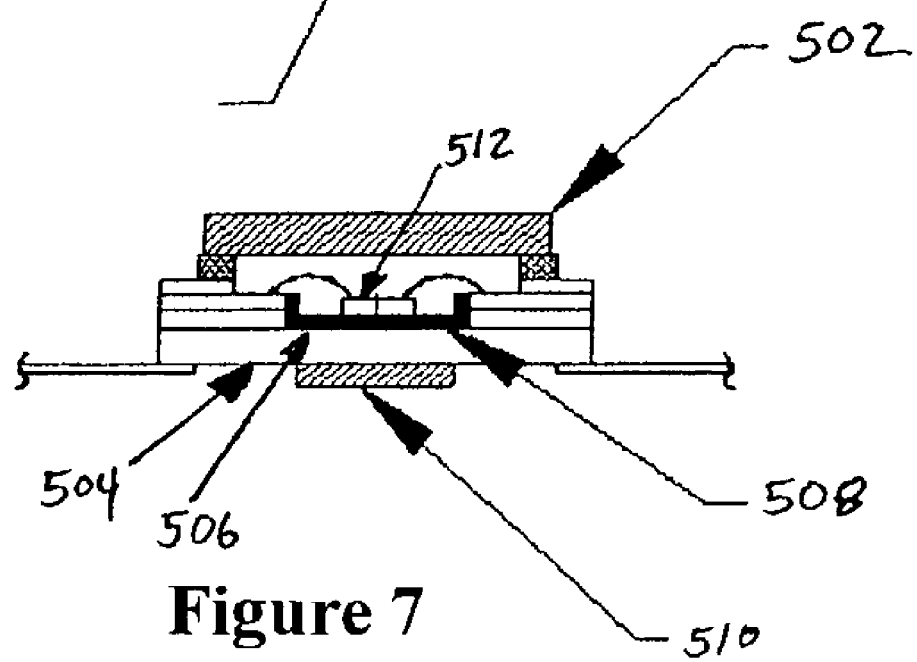
FIG. 7 illustrates a side view of a shielding package formed with a coating layer.

FIG. 7 illustrates a shielding package formed with a coating layer. FIG. 8 illustrates a top view of the shielding package of FIG. 7.

FIG. 7 shows a radiation shielding top 502, a base 504, a base cavity 506, a radiation shielding coating layer 508, a radiation shielding bottom 510, and a circuit die 512.

The base 504 is formed with the base cavity 506. The radiation shielding coating layer 508 is formed inside of the base cavity 506 and on the side walls of the base cavity 506. The circuit die 512 is then coupled to the radiation shielding coating layer 508. The radiation shielding top 502 is coupled to the top of the base 504. Advantageously, the radiation shielding bottom 510 is coupled to the bottom of the base 504.

The radiation shielding coating layer 508 is described in U.S. Pat. No. 6,261,508 B1, of Featherby et al., for a METHOD FOR MAKING A SHIELDING COMPOSITION, incorporated herein by reference as if set forth in its entirety. In one example the radiation shielding coating layer 508 is comprised of 10.0 parts by weight high tap density tungsten powder, 0.15 parts by weight premixed epoxy, and up to 0.50 parts by weight ketone. The tungsten powder serves as a high Z material for shielding the x-rays. The epoxy serves as a binder to help adhere the composition to a surface, and the ketone is added as an extender. It is to be understood that the previous example of the coating material is given to aid in understanding the invention but is not intended as a limitation on the present invention.

The radiation shielding coating layer 508 provides shielding from x-rays for the circuit die 512. The radiation shielding coating layer 508 shields the circuit die 512 from side angle radiation not blocked by the radiation shielding top 502 or the radiation shielding bottom 510.

The radiation shielding top 502 and the radiation shielding coating layer 508 are formed such that there is no line of sight angle which radiation could hit the circuit die 512. Thus, radiation coming from any angle must contact the radiation shielding top 502 or the radiation shielding coating layer 508 before it would come in contact with the circuit die 512. The radiation shielding bottom 510 provides additional shielding for the circuit die 512 from radiation. The radiation shielding coating layer 508 is selected at a thickness and material to shield from x-rays.

The radiation shielding top 502 and the radiation shielding bottom 510 are designed to shield the circuit die 512 from ionizing radiation. The radiation shielding top 502 and the radiation shielding bottom 510 are made of the high Z material which was described previously in the discussion of FIG. 2.

Figure 10:
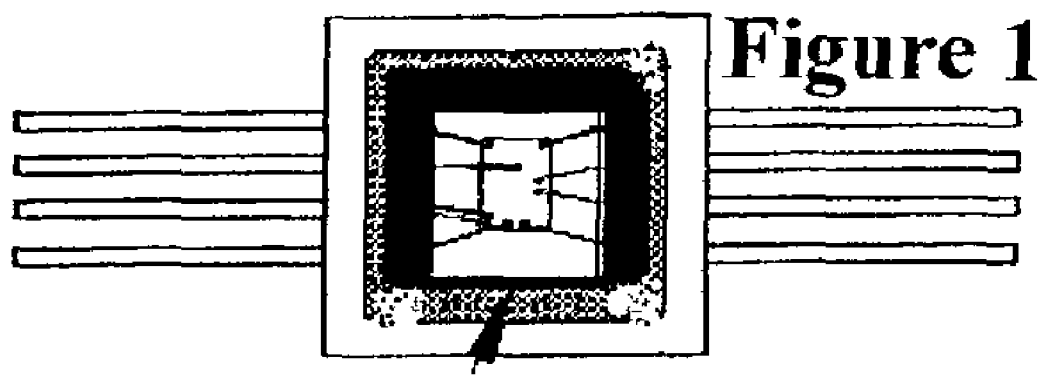
FIG. 10 illustrates a top view of the shielding package of FIG. 9.
Figure 9:
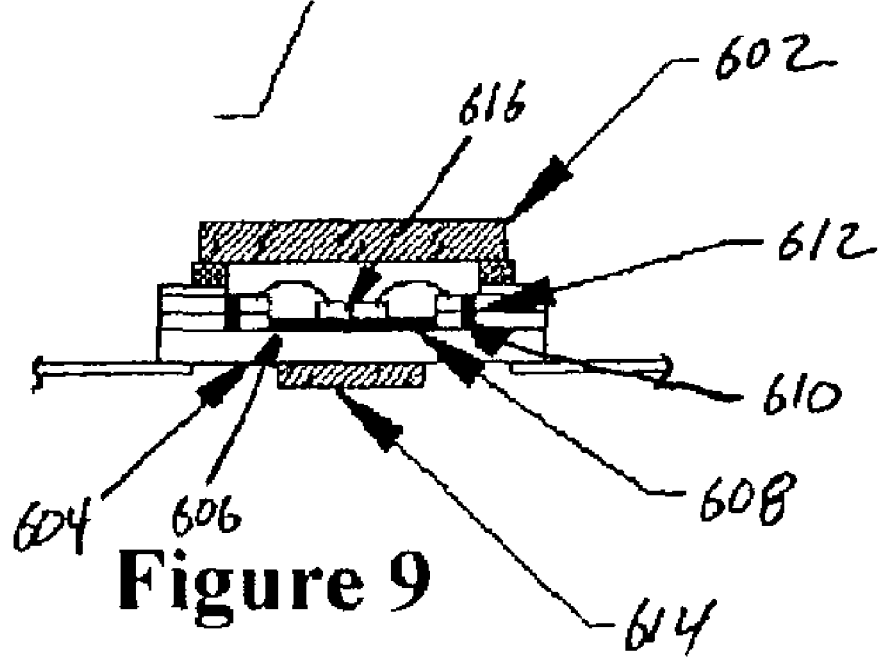
FIG. 9 illustrates a side view of a shielding package formed with coating layer and separate side coating layers.

FIG. 9 illustrates a shielding package formed with coating layer and separate side coating layers. FIG. 10 illustrates a top view of the shielding package of FIG. 9.

FIG. 9 shows a radiation shielding top 602, a base 604, a base cavity 606, a radiation shielding coating layer 608, a canal 610, a side radiation shielding coating layer 612, a radiation shielding bottom 614, and a circuit die 616.

The configuration in FIG. 9 is similar to FIG. 7, except for the canal 610 and side radiation shielding coating layer 612. The side radiation shielding coating layer 612 is the same material as describe in the above discussion of FIG. 5 with reference to the radiation shielding coating layer 508. The side radiation shielding coating layer 612 shields from x-rays in the same way as the side walls of the radiation shielding coating layer 508 of FIG. 7.

The base 604 is formed with the base cavity 606. The radiation shielding coating layer 608 is formed inside of the base cavity 606. The circuit die 616 is then coupled to the radiation shielding coating layer 608. The canal 610 is formed in the base 604. The side radiation shielding coating layer 612 fills the canal 610. The side radiation shielding coating layer 612 and the radiation shielding coating layer 608 provides shielding from x-rays for the circuit die 616.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

The invention claimed is:

1. A radiation shielding integrated circuit device comprising:
    a die of an electronic circuit device;
    an x-ray shielding tub comprising a bottom portion and sidewalls extending from the bottom portion, the die being disposed on the bottom portion between the sidewalls;
    a base coupled to the bottom portion of the x-ray shielding tub opposite the die; and
    a radiation shielding lid coupled to the base;
    wherein
    the radiation shielding lid and the x-ray shielding tub are positioned to shield the die from x-rays from every angle, whereby the die is shielded from receiving from all directions an amount of radiation greater than a total dose tolerance of the die; and
    the radiation shielding lid is not in direct contact with the x-ray shielding tub so that the radiation shielding lid and the x-ray shielding tub do not completely enclose the die.

2. The radiation shielding integrated circuit device of claim 1 wherein the x-ray shielding tub has a first thickness, the radiation shielding lid has a second thickness, the second thickness being greater than the first thickness so that the radiation shielding lid provides greater shielding of ionizing radiation than the x-ray shielding tub.

3. The radiation shielding integrated circuit device of claim 1 wherein the radiation shielding lid comprises a high Z material.

4. The radiation shielding integrated circuit device of claim 1 wherein the radiation shielding lid comprises a high Z material and a low Z material.

5. The radiation shielding integrated circuit device of claim 1 further comprising a spacing ring coupled to the radiation shielding lid and to the base.

6. The radiation shielding integrated circuit device of claim 5 wherein the spacing ring comprises a high Z material.

7. The radiation shielding integrated circuit device of claim 5 wherein the spacing ring comprises a low Z material.

8. A radiation shielding integrated circuit device comprising:
    a base comprising a first surface and a second surface opposite the first surface;
    a first x-ray shielding tub comprising a first bottom portion and first sidewalls extending from the first bottom portion, the first x-ray shielding tub being coupled to the first surface of the base;
    a second x-ray shielding tub comprising a second bottom portion and second sidewalls extending from the second bottom portion, the second x-ray shielding tub being coupled to the second surface of the base;
    a first circuit die disposed on the first bottom portion between the first sidewalls of the first x-ray shielding tub;
    a second circuit die disposed on the second bottom portion between the second sidewalls of the second x-ray shielding tub;
    a radiation shielding top coupled to the base; and
    a radiation shielding bottom coupled to the base;
    wherein
    the radiation shielding top and the radiation shielding bottom comprise material shielding x-rays and ionizing radiation;
    the first x-ray shielding tub and the second x-ray shielding tub comprise material shielding x-rays;
    the radiation shielding top and the first x-ray shielding tub are positioned to shield the first die from x-rays from any angle;
    the radiation shielding bottom and the second x-ray shielding tub are positioned to shield the second die from x-rays from any angle;
    the thickness of the first x-ray shielding tub and the thickness of the radiation shielding top are selected to shield the first circuit die from receiving an amount of x-rays greater than the total dose tolerance of the first circuit die; and
    the thickness of the second x-ray shielding tub and the thickness of the radiation shielding bottom are selected to shield the second circuit die from receiving an amount of x-rays greater than the total dose tolerance of the second circuit die.

9. The radiation shielding integrated circuit device of claim 8 wherein
    the radiation shielding to is spaced from the first sidewalls of the first x-ray shielding tub, so that enclosure of the first circuit die by the radiation shielding top and the first x-ray shielding tub is incomplete; and
    the radiation shielding bottom is spaced from the second sidewalls of the second x-ray shielding tub, so that enclosure of the second circuit die by the radiation shielding bottom and the second x-ray shielding tub is incomplete.

10. The radiation shielding integrated circuit device of claim 8 further comprising:
    a first spacing ring coupled to the radiation shielding top and to the base;
    a second spacing ring coupled to the radiation shielding bottom and to the base.

11. The radiation shielding, integrated circuit device of claim 10 wherein the first spacing ring and the second spacing ring comprise a high Z material.

12. The radiation shielding integrated circuit device of claim 10 wherein the first spacing ring and second spacing ring comprise a low Z material.

13. The radiation shielding integrated circuit device of claim 8 wherein the radiation shielding top and the radiation shielding bottom comprise a high Z material.

14. The radiation shielding integrated circuit device of claim 8 wherein the first circuit die is shielded from receiving an amount of radiation greater than a total dose tolerance of the first circuit die.

15. The radiation shielding integrated circuit device of claim 8 wherein the second circuit die is shielded from receiving an amount of radiation greater than a total dose tolerance of the second circuit die.

16. The radiation shielding integrated circuit device of claim 9, wherein:
   thickness of the radiation shielding top is greater than thickness of the first x-ray shielding tub; and
   thickness of the radiation shielding bottom is greater than thickness of the second x-ray shielding tub.

17. An integrated circuit, comprising:
   at least one circuit die;
   means for shielding the at least one circuit die from isotropic ionizing radiation, wherein the means for shielding the at least one circuit die from isotropic ionizing radiation is configured
      to shield the at least one circuit die from x-ray radiation from first selected angles, and
      allows x-rays to reach the at least one circuit die from second selected angles; and
   means for shielding the at least one circuit die from x-ray radiation from all angles.

18. An integrated circuit, comprising:
   at least one circuit die;
   an x-ray shielding tub comprising a bottom portion and sidewalls extending from the bottom portion, the bottom portion and the sidewalls comprising material for shielding from x-rays;
   a first radiation shielding lid comprising material for shielding from ionizing radiation and x-rays; and
   a second radiation shielding lid comprising material for shielding from ionizing radiation and x-rays;
   wherein:
   the at least one circuit die is disposed in the x-ray shielding tub;
   the x-ray shielding tub is disposed between the first radiation shielding lid and the second radiation shielding lid;
   the x-ray shielding tub, the first radiation shielding lid, and the second radiation shielding lid are configured to shield the at least one circuit die from x-rays from every direction; and
   the x-ray shielding tub, the first radiation shielding lid, and the second radiation shielding lid do not completely enclose the at least one circuit die.

19. The integrated circuit of claim 18, wherein:
   the first radiation shielding lid is not in direct contact with the x-ray shielding tub; and
   the second radiation shielding lid is not in direct contact with the x-ray shielding tub.

20. The integrated circuit of claim 18, wherein:
   the x-ray shielding tub provides less shielding of ionizing radiation than the first radiation shielding lid; and
   the x-ray shielding tub provides less shielding of ionizing radiation than the second radiation shielding lid.

21. The integrated circuit of claim 18, wherein:
   the x-ray shielding tub is thinner than the first radiation shielding lid; and
   the x-ray shielding tub is thinner than the second radiation shielding lid.

22. An integrated circuit, comprising:
   a base;
   at least one circuit die;
   an x-ray shielding tub comprising a bottom portion and sidewalls extending from the bottom portion, the bottom portion and the sidewalls comprising material for shielding from x-rays;
   a first lid comprising material for shielding from ionizing radiation and x-rays;
   a second lid comprising material for shielding from ionizing radiation and x-rays;
   a first spacing ring comprising material for shielding from x-rays; and
   a second spacing ring comprising material for shielding from x-rays;
   wherein:
   the at least one circuit die is disposed in the x-ray shielding tub;
   the x-ray shielding tub is disposed on the base between the first lid and the second lid;
   the first spacing ring is disposed between the base and the first lid, surrounding the x-ray shielding tub;
   the second spacing ring is disposed between the base and the second lid;
   the x-ray shielding tub, the first and second lids, and the first and second spacing rings are configured to shield the at least one circuit die from x-rays from every direction; and
   the x-ray shielding tub, the first and second lids, and the first and second spacing rings do not completely enclose the at least one circuit die.

* * * * *

UNITED STATES PATENT AND TRADEMARK OFFICE
CERTIFICATE OF CORRECTION

PATENT NO. : 7,382,043 B2
APPLICATION NO. : 10/065209
DATED : December 11, 2007
INVENTOR(S) : Larry L. Longden and Janet Patterson It is certified that error appears in the above-identified patent and that said Letters Patent is hereby corrected as shown below:

Column 10, line 43, cancel "to" and replace the cancelled text with --top--;

Column 10, line 59, cancel "shielding, integrated" and replace the cancelled text with --"shielding integrated--.

Signed and Sealed this

Twenty-ninth Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,382,043 B2 | Page 1 of 1 |
| APPLICATION NO. | : 10/065209 | |
| DATED | : June 3, 2008 | |
| INVENTOR(S) | : Larry L. Longden and Janet Patterson | |

It is certified that error appears in the above-identified patent and that said Letters Patent is hereby corrected as shown below:

Column 10, line 43, cancel "to" and replace the cancelled text with --top--;

Column 10, line 59, cancel "shielding, integrated" and replace the cancelled text with --"shielding integrated--.

This certificate supersedes the Certificate of Correction issued July 29, 2008.

Signed and Sealed this

Twenty-sixth Day of August, 2008

JON W. DUDAS
*Director of the United States Patent and Trademark Office*